(12) United States Patent
Milani et al.

(10) Patent No.: US 9,361,982 B2
(45) Date of Patent: *Jun. 7, 2016

(54) EMBEDDED NON-VOLATILE MEMORY WITH SINGLE POLYSILICON LAYER MEMORY CELLS PROGRAMMABLE THROUGH BAND-TO-BAND TUNNELING-INDUCED HOT ELECTRON AND ERASABLE THROUGH FOWLER-NORDHEIM TUNNELING

(71) Applicant: STMICROELECTRONICS S.r.l., Agrate Brianza (IT)

(72) Inventors: Luca Milani, Mairano (IT); Fabrizio Torricelli, Brescia (IT); Anna Richelli, Brescia (IT); Luigi Colalongo, Bertinoro (IT); Zsolt Miklos Kovàcs-Vajna, Brescia (IT)

(73) Assignee: STMICROELECTRONICS S.R.L., Agrate Brianza (MB) (IT)

( * ) Notice: Subject to any disclaimer, the term of this patent is extended or adjusted under 35 U.S.C. 154(b) by 0 days.

This patent is subject to a terminal disclaimer.

(21) Appl. No.: 14/605,350

(22) Filed: Jan. 26, 2015

(65) Prior Publication Data

US 2015/0221372 A1 Aug. 6, 2015

(30) Foreign Application Priority Data

Feb. 4, 2014 (IT) .............................. MI2014A0155

(51) Int. Cl.
| | | |
|---|---|---|
| *G11C 16/10* | (2006.01) | |
| *G11C 16/04* | (2006.01) | |
| *G11C 16/26* | (2006.01) | |
| *H01L 27/115* | (2006.01) | |
| *H01L 21/28* | (2006.01) | |

(Continued)

(52) U.S. Cl.
CPC ............ *G11C 16/0408* (2013.01); *G11C 16/10* (2013.01); *G11C 16/26* (2013.01); *H01L 21/28273* (2013.01); *H01L 27/11519* (2013.01); *H01L 27/11521* (2013.01); *H01L 27/11558* (2013.01); *H01L 29/66825* (2013.01); *H01L 29/7881* (2013.01); *H01L 29/7883* (2013.01)

(58) Field of Classification Search
CPC ........................... G11C 16/10; G11C 16/0483
USPC ....................................... 365/185.28, 185.24
See application file for complete search history.

(56) References Cited

U.S. PATENT DOCUMENTS

| | | | |
|---|---|---|---|
| 5,707,897 A * | 1/1998 | Lee ................... | H01L 29/42324 257/E21.682 |
| 5,761,126 A | 6/1998 | Chi et al. | |
| 5,940,324 A | 8/1999 | Chi et al. | |

(Continued)

*Primary Examiner* — Michael Tran
(74) *Attorney, Agent, or Firm* — Allen, Dyer, Doppelt, Milbrath & Gilchrist, P.A.

(57) ABSTRACT

A non-volatile memory includes a plurality of memory cells arranged in a plurality of rows and columns. Each memory cell includes a read portion and a control portion. The read portion and the control portion share an electrically floating layer of conductive material defining a first capacitive coupling with the read portion and a second capacitive coupling with the control portion. The first capacitive coupling defines a first capacity greater than a second capacity defined by the second capacitive coupling. The control portion is configured so that an electric current injects or extracts charge carriers into or from the electrically floating layer to store of a first logic value or a second logic value, respectively, in the memory cell.

16 Claims, 9 Drawing Sheets

(51) Int. Cl.
*H01L 29/788* (2006.01)
*H01L 29/66* (2006.01)

(56) References Cited

U.S. PATENT DOCUMENTS

| | | | |
|---|---|---|---|
| 7,313,026 B2 * | 12/2007 | Shiba | G11C 16/0408 257/E21.662 |
| 7,869,279 B1 | 1/2011 | Ratnakumar | |
| 8,693,256 B2 | 4/2014 | Pasotti et al. | |
| 8,884,241 B2 * | 11/2014 | Hall | G01T 1/24 250/370.14 |
| 2007/0296020 A1 | 12/2007 | Shiba et al. | |
| 2009/0080257 A1 | 3/2009 | Oka et al. | |
| 2011/0157977 A1 | 6/2011 | Pasotti et al. | |
| 2013/0343128 A1 | 12/2013 | Torricelli et al. | |

* cited by examiner

EMBEDDED NON-VOLATILE MEMORY WITH SINGLE POLYSILICON LAYER MEMORY CELLS PROGRAMMABLE THROUGH BAND-TO-BAND TUNNELING-INDUCED HOT ELECTRON AND ERASABLE THROUGH FOWLER-NORDHEIM TUNNELING

TECHNICAL FIELD

The approach according to one or more embodiments of the present invention relates to the field of electronics. More specifically, this approach relates to non-volatile memory devices.

BACKGROUND

Non-volatile memory devices are used in any application that where the storage of information is to be maintained even when the memory devices are not powered. In recent years, the market of non-volatile integrated memories (or embedded Non-Volatile Memory—emNVM) has undergone considerable development. The emNVM are implemented with other devices on a single chip to obtain (electronic) systems on chip (System-on-Chip—SoC). The emNVM are implemented in the SoC, for example, to allow post-production calibration/adjustment (e.g., for analog and/or radio-frequency circuits) by the manufacturer and/or post-production customization/configuration by the final user. Moreover, the NVM are implemented in a SoC that for storing a limited amount of data in systems such as radio frequency identification (RFID).

Several technological approaches are available to create an emNVM. Some approaches allow a single programming (one time programmable) of the emNVM, such as poly-fuse or anti-fuse emNVM types.

Other technological approaches allow performing more write cycles of the emNVM, such as in the case of EEPROM (Electrical Erasable and Programmable Read-Only Memory) or FLASH emNVM, which store a datum by trapping electric charges in an insulated, or floating (floating gate), terminal of a storage transistor. However, such types of memory cells use technologies and processes that may not be included in standard CMOS (e.g., to provide the floating gate transistors) usually used to implement a SoC. In fact, the storage transistors have an additional polysilicon layer to define regions of their floating gates (in addition to that used to define their control gate regions as in the standard CMOS). This difference adds design complexity, which significantly increases the manufacturing cost of memory devices.

In the art, floating gate type memory cells obtainable using standard CMOS processes have been developed. For example, single-poly EEPROM (or single polysilicon EEPROM) were developed, which may be implemented in standard CMOS technology because they use only polysilicon one level.

In such memory cells the floating gate is made from a single layer of polysilicon shared between a control capacitor, which dominates and controls the potential of the gate terminal of a MOS transistor connected thereto by means of capacitive coupling. The programming and erasing of the cell may occur by hot carrier injection (HCI), such as channel hot electron (CHE), or for Fowler-Nordheim (FN) tunneling in the floating gate in proximity of the drain region of the floating gate transistor. Italian Patent Application No. MI2009A002349 by the Applicant of the present application discloses an emNVM that implements memory cells of single-poly type.

In addition to the more common mechanisms of FN tunneling injection and CHE, another mechanism includes band-to-band tunneling-induced hot electron (BBHE) for the programming operation in single-poly EEPROM. U.S. Pat. Nos. 5,940,324 and 5,761,126 disclose examples of memory cells programmed by BBHE generated corresponding to the drain region of a MOS transistor of the memory cell.

Such memory cells include rather complex (and of considerable size on the chip) control circuitry (e.g., row and column decoders, reading and writing unit, etc.) because they generate and provide to each cell in a matrix of the emNVM, a plurality of different voltages, also of high value (compared with a supply voltage of the SoC in which the emNVM is integrated).

SUMMARY

In general terms, an approach according to one or more embodiments of the present invention provides an emNVM comprising a matrix of memory cells that is compact and simply addressable with reduced voltage values in such a way to simplify a control structure necessary to operate on the matrix of memory cells compared with known emNVMs. Particularly, one or more aspects of the approach according to specific embodiments are indicated in the independent claims, with advantageous features of the solution that are indicated in the dependent claims.

More specifically, one aspect of the approach according to an embodiment provides a non-volatile memory integrated in a chip of semiconductor material. The non-volatile memory comprises a plurality of memory cells arranged in a plurality of rows and columns. Each memory cell comprises a read portion and a control portion. The read portion and the control portion share an electrically floating layer of conductive material. The electrically floating layer provides a first capacitive coupling with the read portion and a second capacitive coupling with the control portion. The read portion of each memory cell is formed in the chip in a first well of semiconductor material having a doping of a first type, while the control portion is formed in the plate in a second well of semiconductor material having a doping of a second type. The read portion is configured to be traversed by or have an electrical current flow therethrough indicative of a logic value stored in the memory cell during a read operation of the memory cell.

In the approaches according to an embodiment, the first capacitive coupling defines a first capacity greater than a second capacitance defined by the second capacitive coupling. Furthermore, the control portion is configured to be traversed by an electric current adapted to inject or extract charge carriers from the electrically floating layer in order to impose the storage of a first logic value or of a second logic value, respectively, in the memory cell.

DETAILED DESCRIPTION

An approach according to one or more embodiments, as well as additional features and its advantages, will be best understood by reference to the following detailed description, given purely by way of non-limiting example, to be read in conjunction with the accompanying figures (in which corresponding elements are indicated with the same or similar references and their explanation is not repeated for brevity). In this respect, it is expressly understood that the figures are not necessarily to scale (with some details that may be exaggerated and/or simplified) and that, unless otherwise indicated, they are simply used to conceptually illustrate the structures and procedures described.

Figure 1:
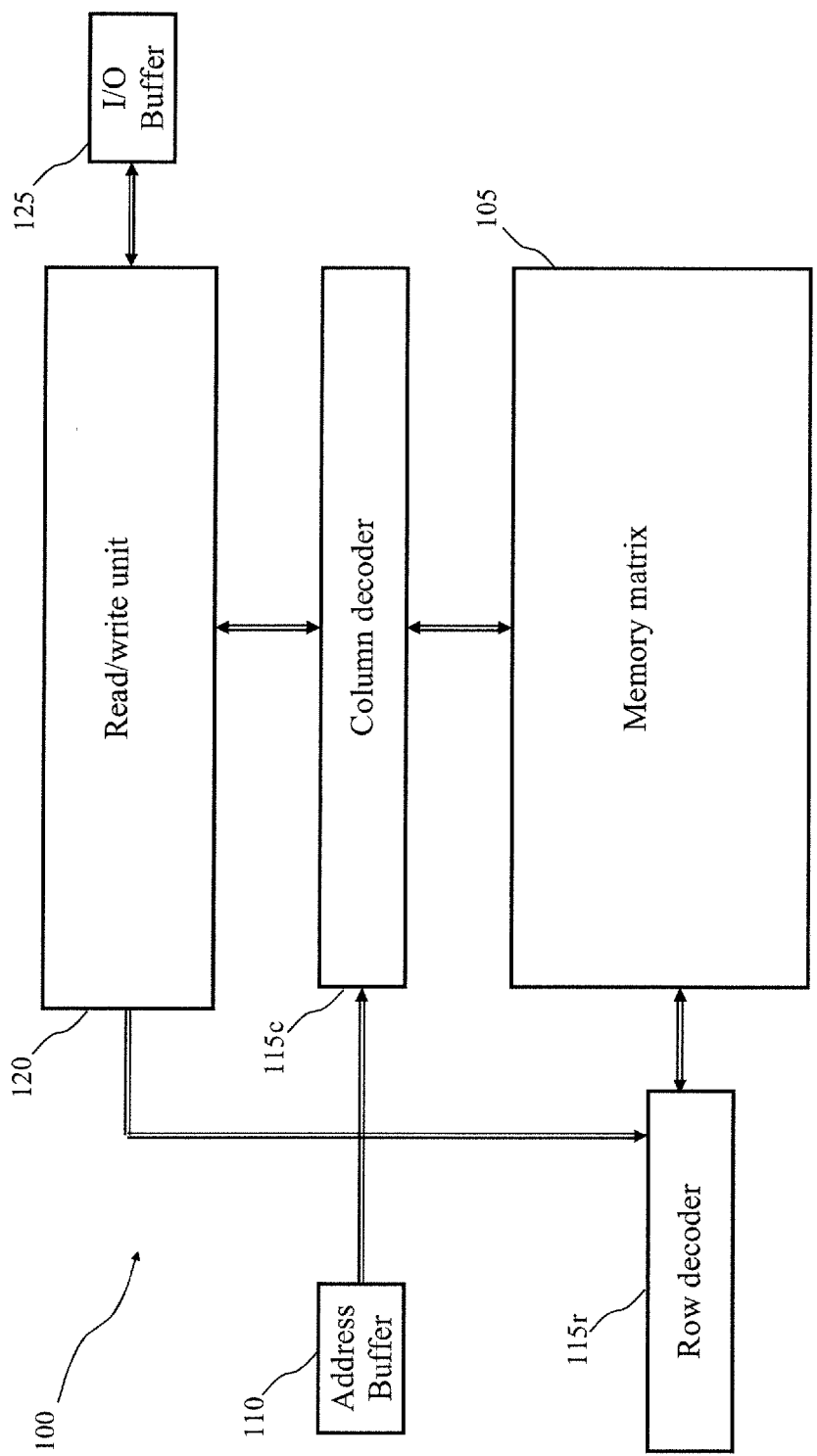
FIG. 1 is a block diagram of an emNVM in which the approach according to the present invention may be implemented.

With reference to the figures, FIG. 1 is a block diagram of an emNVM in which the approach according to the present invention may be implemented. The memory device 100 is non-volatile integrated, or emNVM (embedded Non-Volatile Memory). The memory device 100 comprises a matrix 105, which is formed by a plurality of memory cells (not shown in the figure) that are organized in rows and columns (for example, 128-512 and 512-1024 rows columns). Each memory cell stores a logic value (e.g., corresponding to a bit of information). For this purpose, the memory cell is based on a floating-gate MOS transistor. This transistor has a threshold voltage which depends on an electrical charge in its floating gate. The different levels of the threshold voltage represent corresponding logic values. Conventionally, the memory cell is programmed (to a logic value 0) when it has a high threshold voltage, while the memory cell is erased (to a logic value 1) when it has a low threshold voltage.

In one embodiment, as described in detail below, the memory device 100 may individually erase each memory cell, the programming is performed simultaneously for a set of memory cells (for example, a word or a sector). The reading of the cells of the matrix 105 may be performed for single cell.

An address buffer 110 receives an address of a memory cell or a set of memory cells (for example, to a corresponding word) in the matrix 105. In particular, a portion of the address is supplied to a row decoder 115r, which selects the selected row in the matrix 105, and the other portion of the address is instead supplied to a column decoder 115c, which selects a column in the matrix 105 among the columns of the matrix 105. In this way, it is possible to (electrically) access to each memory cell of the matrix 105.

A read/write unit 120 controls the operation of the row decoder 115r and of the column decoder 115c. The read/write unit 120 furthermore comprises all the components (such as power management unit with charge pumps, sense amplifiers, comparators, reference cells, pulse generators, and the like) that are used to write (i.e., program, or erase) the memory cells and read their logic values. The read/write unit 120 is also coupled with an input/output (I/O) buffer 125, the input/output buffer 125 receives data (one or more bits) to be written in the matrix 105, or provides the data read from the matrix 105.

Figure 2A:
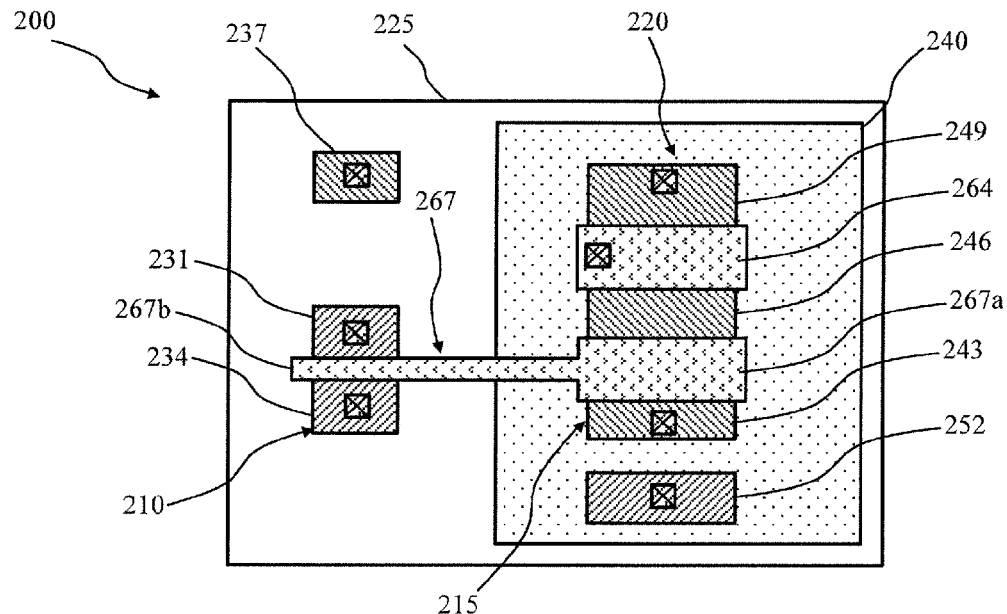
FIG. 2A is a schematic plan view of a memory cell according to an embodiment of the present invention.
Figure 2B:
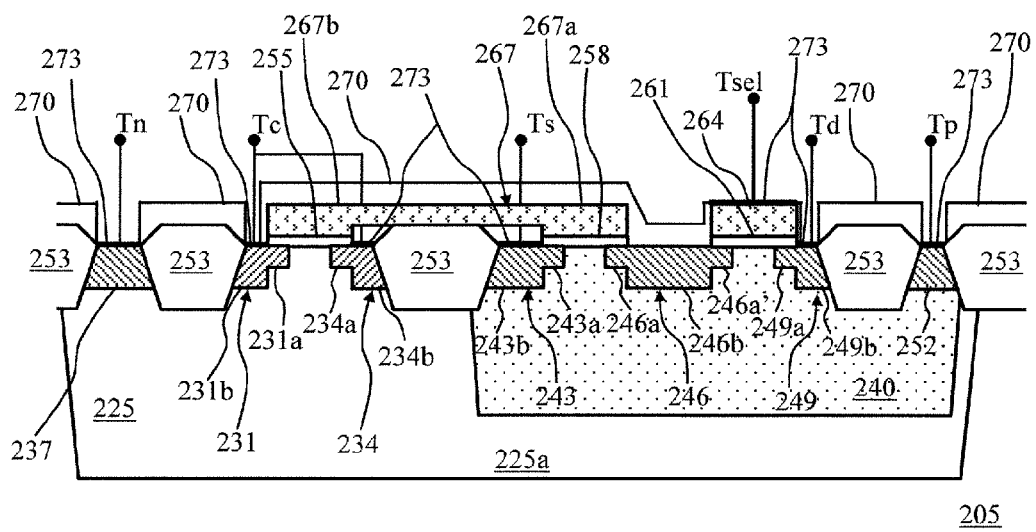
FIG. 2B is a schematic cross-sectional view of the memory cell of FIG. 2A.

Turning now to FIGS. 2A and 2B, which are schematic plan and cross-sectional views, respectively, of a memory cell 200 according to an embodiment, the memory cell 200 is integrated within a portion of substrate 205 of a chip in semiconductor material (e.g., silicon Si). The portion of the substrate may have a p-type doping (as in the case of silicon doped with boron B).

The memory cell 200 comprises a control portion which in its turn comprises a capacitive element 210, and a read portion which in its turn comprises a memory transistor 215 and a selection transistor 220. An n well 225 with an n-type doping (as in the case of silicon doped with phosphor P) extends from a surface of the chip 228 in the substrate 205 (down to a first depth). Advantageously, the n well 225 comprises a deep region 225a of n-type doping with a higher doping concentration than the doping of the n well 225—indicated as n+ doping in the following. This deep region 225a defines a (bottom) boundary of the substrate 205.

Two plate regions 231 and 234 with a p-type doping corresponding to a first plate of the capacitive element 210, are formed in the n well 225. The plate regions 231 and 234 have a p-type doping concentration higher than the doping of the substrate 205—identified as p+ doping in the following. Preferably, the plate regions 231 and 234 each comprises an extension portion 231a and 234a, which extend towards each other in the proximity of the surface 228 and have a p-type doping—indicated as p* doping in following—different from (for example, lower than) the p+ doping of a main portion 231b and 234b of the plate regions 231 and 234, respectively.

Inside the n well 225 is also formed a n+ contact region 237, having a n+ type doping to electrically contact the n well. A p well 240 is formed inside the n well 225. The p well 240 extends from the surface of the plate 228 toward the inside of the n well 225 (down to a second depth lower than the first depth).

Inside the p well 240 four distinct regions 243, 246, 249 and 252 are formed, three of which 243, 246, 249 are n+ doped and one 252 p+ doped. In the following, the first n+ region is indicated as source region 243, as it corresponds to the source region of the memory transistor 215, and the second region n+ is indicated as the shared region 246, as it corresponds to the drain region of the memory transistor 215 and to the source region of the selection transistor 220, while the third n+ region is indicated as drain region 249, as it corresponds to the drain region of the selection transistor 220. Finally, the fourth region is indicated as p well contact region, or simply p+ contact region 252, and is used to electrically contact the p well 240.

Preferably, the source regions 243 and shared 246 each comprises an extension portion 243a and 246a, which extend towards each other in the proximity of the surface 228, and have an n-type doping—referred to as doping n* hereinafter—different from (for example, lower than) the n+ doping of a main portion 243b and 246b of the regions 243 and 246, respectively. In one embodiment, the drain region also comprises an extension portion 249a of n* type which extends from an n+ type main portion 249b towards an additional extension portion 246a' of the shared region 246.

A plurality of insulating decoupling elements 253 (for example, a plurality of insulating trenches or shallow trench insulation—STI) are formed at the surface 228 so as to extend, with their main portion, towards the inside of the chip and, with a minor portion, above the surface 228 of the chip. Advantageously, the decoupling layer 253 is shaped so as to define a plan view of the wells 225 and 240, thus delimiting and (electrically) insulating the latter one another and any other neighboring elements possibly formed in the same chip.

A capacitor insulating layer 255 of electrically insulating material (e.g., silicon oxide ($SiO_2$)) is formed on the surface 228 of the plate, in a space above, and substantially delimited by, the plate regions 231 and 234 (with the extension portions 231a and 234a which extend in the n well 225 below the capacitor insulating layer 255). Similarly, an cell insulating layer 258 of electrically insulating material is formed on the surface 228 of the chip, in a space above, and substantially delimited by, the regions 243 and 246 (so as to form the oxide layer of the memory transistor 215 and with the extension portions 243a and 246a which extend in the p well 240 below the cell insulating layer 258).

A selector insulating element 261 of electrically insulating material is formed on the surface 228 of the plate, in a space above, and substantially delimited by, the regions 246 and 249 (so as to form the oxide layer of the selection transistor 220). A polysilicon gate layer 264 is formed on the selection insulating layer 261 (so as to form the gate region of the selection transistor 220).

A floating coupling layer 267 of polysilicon, hereinafter referred to as the floating layer 267 for simplicity, is formed between the capacitor insulating layer 255 and the cell insulating layer 258. In this way, a capacitor portion 267a of the floating layer 267 forms a second plate of the capacitive element 210 while a transistor portion 267b of the floating layer 267 forms the gate region of the memory transistor 215. The floating layer 267 is completely covered by a passivating layer (not shown, for example, made of silicon oxide and/or other insulating compounds as silicon nitride).

One or more oxide layers 270 (e.g., a layer of silicon oxide and/or silicon nitride) are formed to cover (and electrically insulate) the floating layer 267, the gate layer 264 and the insulating layers 255, 258 and 261. The floating layer 267 is electrically insulated from what formed in the substrate 205 because of the oxide layers 270.

Corresponding to the regions 237, 231, 234, 243, 249 and 252, respective layers of salicide 273 of a metallic material (e.g., cobalt—defined as transition metal) are formed to facilitate a subsequent electrical connection with metal elements for electrical connection formed later through higher levels of metallization. Preferably, the salicide layer 273 is formed only on a (contact) respective portion of the regions 237, 231, 234, 243, 249 and 252, for example, in FIG. 2A wherein such contact portions are indicated by a respective square.

The regions 237, 231, 234, 243, 249, 252 and the gate layer 264 are connected to the upper metallization layers (shown schematically by a line in FIG. 2B) to form the corresponding n well Tn, condenser Tc (connected to both the plate regions 231 and 234), source Ts, and drain Td. The p well Tp and selection Tsel terminals are to be electrically connected to elements external to the memory cell 200 (e.g., the line decoder 115r and the column decoder 115c shown in FIG. 1).

Because of the structure described above, the memory cell 200 (in particular because of the deep region 225a) does not electrically interact significantly with the substrate 205 of the chip in which it is integrated. Therefore, the memory cell 200 is substantially electrically insulated from any other memory cells 200 and/or other devices (not shown) formed in the substrate 205 (and therefore electromagnetic interference between the memory cells 200 formed in the substrate 205 are suppressed or at least substantially attenuated).

In one embodiment, the floating layer 267 is formed to define a capacitive coupling factor α between a predetermined capacity Cc of the capacitive element 210 and a capacitance Ct of the memory transistor 215. The floating layer 267 is formed with a transistor portion 267a having a size (an area) larger than the size of a capacitive portion 267b. Preferably, the size of the portions 267a and 267a are selected in such a way to obtain a capacitive coupling factor α equal to:

$$\alpha = \frac{Cc}{Cc + Ct} \leq 0.5; \text{(e.g., } \alpha = 0.2\text{)}. \quad (1)$$

In other words, the capacitive coupling factor α tending to zero (i.e., opposite to a value of capacitive coupling defined in the memory cells known in which a capacitive coupling factor tends to one) makes the floating layer 267 (corresponding to the floating region of a classic floating gate transistor) mainly coupled, from the electrical point of view, to the p+ contact region 252 rather than to voltages applied to the n+ contact region 237.

Because of the structure described above and the resulting capacitive coupling α, it is possible to perform an erase operation (imposing the logic 1 vale as stored datum) of the memory cell 200 by the Fowler-Nordheim tunneling (or FN tunneling) phenomenon.

A program operation (imposing the logic 0 value as stored datum) of the memory cell 200 is performed by the band-to-band tunneling induced hot electron (BBHE) phenomenon. Because of the structure of the memory cell 200, both phenomena (FN tunneling and BBHE) occur corresponding to the insulating layer of the capacitor 255 (i.e., the injection/extraction of charge carriers, such as electrons, into/from the floating layer 267 occurs through the terminal of the capacitive element 210).

After having described the structure of the memory cell 200, now an operation of the same according to one embodiment will be described. The memory cell 200 may be controlled by applying appropriate voltages to the terminals Tn, Tc, Ts, Td, Tp and Tsel. According to the value of the applied voltages, the memory cell 200 may be controlled to store the logic 1 value, through the erase operation, to store the logic 0 value, through the program operation, or for detecting a previously stored value, through a read operation.

To ensure a granularity of control equal to a bit in a matrix (such as the matrix 105 of FIG. 1) of memory cells 200 (i.e., to control the data stored in a single memory cell 200 independently from other memory cells 200 that form the matrix 105) it is desirable to have the ability to inhibit at least one of the between the program or erase operations (in such a way to be able to restrict the program/erase operation to a single selected memory cell 200).

Table 1 below is an example of biasing schemes applicable to the terminals Tn, Tc, Ts, Td, Tp and Tsel of the memory cell 200 according to the selected operation between the erase, program and read operations or an erase inhibition operation.

TABLE 1

|  | Tn | Tc | Tp | Tsel | Ts | Td |
| --- | --- | --- | --- | --- | --- | --- |
| Erase | Ve | Ve | GND | GND | GND | GND |
| Program | GND | Vp | GND | GND | GND | GND |
| Read | Vr | Vr | GND | Vdd | GND | Vd |
| Erase inhibition | Ve | Vi | GND | GND | GND | GND |

In order to perform the erase operation, the terminals Tn and Tc are brought to an erase voltage Ve of high value (e.g., Ve=15V in a technology with a supply voltage Vdd comprised between 3V and 5V), while the other terminals Ts, Td, Tp and Tsel are maintained to a reference voltage GND (e.g., GND=0V). In this configuration, because of the capacitive coupling factor α, an electric potential of the floating layer 267 may be close to a potential of the p well terminal Tp (namely, GND in the example considered). The electric potential of the capacitor portion 267b of the floating layer 267 that results may be substantially different from (in particular, it is substantially lower than) the value of the erase voltage Ve that biases the terminals Tn and Tc. Consequently, the potential drop on the capacitor insulating layer 255 (substantially corresponding to the erase voltage Ve in the considered example) is for obtaining an intensity able to activate a FN tunneling current through the capacitor insulating layer 255. The intensity is such as to extract the charge carriers (such as electrons) trapped in the floating layer 267 (thereby imposing the logic 1 value in the memory cell 200).

The plate regions 231 and 234, through the extension portions 231a and 234a, generate an electric field when biased through the terminal Tc to the erase voltage Ve. Such electric field extends in the region of the n well 225 below the capacitor insulating layer 255 (also referred to as the channel region). The electric field has an intensity such as to determine an extraction of electrons stored in the floating layer 267 substantially uniform in the channel region (in a similar way to what happens in the floating gate transistors implemented in FLASH memories).

The program operation exploits the BBHE, which occurs through the insulating layer 255 in the proximity of the extension portions 231a and 234a of the plate regions 231 and 234. In order to promote the BBHE, the capacitor terminal Tc is brought to a voltage value lower than the voltage value applied to the remaining terminals Tn, Tc, Ts, Td, Tp and Tsel. For example, as reported in Table 1, a programming voltage Vp having a negative value (Vp=−5V) may be applied to the capacitor terminal Tc, while the terminals Tn, Tc, Ts, Td, Tp and Tsel are maintained to the reference voltage GND.

In an alternative embodiment (for example, in which negative voltage values are not available), to promote the BBHE, terminals Tn, Tc, Ts, Td, Tp and Tsel are brought to a programming voltage Vp having a positive value (e.g., Vp=5V), while the capacitor terminal Tc is maintained at the reference voltage GND (obtaining a substantially complementary pattern of biasing compared with what is indicated in Table 1).

During the program operation, a fraction Ibbhe (generated through BBHE) of the electric current Icn flowing between the terminals Tc and Tn is injected into the floating layer 267 through the capacitor insulating layer 255 by BBHE (in other words, through the BBHE, carriers are injected in the floating layer 267, thereby imposing the logic 0 value in the memory cell 200). Advantageously, the efficiency of injection of the BBHE, i.e. the ratio between the ration between the injected electric current Ibbhe and the generated electric current Icn, appears to be generally better than the efficiency obtainable with CHE or similar phenomena usually used in the known memory cells. In fact, the current intensity to stimulate the CHE appears to be substantially greater than the current intensity required to stimulate the BBHE.

In addition, the program operation via BBHE uses a programming voltage Vp having a value substantially lower than the values to execute a program operation by FN tunneling. In an embodiment, the voltage value Vp is of the order of the supply voltage Vdd value (then the programming voltage Vp may be generated without charge pumps, allowing to contain a power consumption to manage the emNVM and a complexity in providing the electrical connections with the memory cell 200 and other elements of emNVM 100, as described hereinbelow).

The read operation of the data stored is done by measuring a drain current Id of the memory transistor 215, after having enabled the selection transistor 220 by biasing the terminal Tsel to the supply voltage Vdd, the terminals Tc and Tn to a read voltage Vr and the terminal Td to a drain voltage Vd, while the terminal Ts is maintained at the reference voltage GND. On the basis of the measured value of the current Id it is possible to extrapolate the value of the threshold voltage of the memory transistor 215, and thus the logic value stored in the memory cell 200 (in other words, the current Id provides an indication of the logic value stored in the memory cell 200).

In one embodiment, the current Id can provide an indication of the logic value stored in an indirect way. For example, the threshold voltage of the memory transistor 215 may be determined from the value of the read voltage Vr to be applied to terminal Tc and Tn, maintaining the terminal Td to the drain voltage Vd with a constant value (e.g, Vd=1V), to measure a current Id known (e.g., Id=10 µA).

As known, the charge carriers (e.g., electrons) injected into the floating layer 267 during the program operation move the threshold voltage of the memory transistor 215 to a program value $Vth_{prog}$ greater than a thermal equilibrium value (i.e., $Vth_{prog} > Vth_{eq}$). Otherwise, the charge carriers extracted from the floating layer 267 during the erase operation move the threshold voltage of the memory transistor 215 to an erase value $Vth_{erase}$ lower than the thermal equilibrium value (i.e., $Vth_{erase} < Vth_{eq}$). As known, the greater the distance between the erase value $Vth_{erase}$ and program value $Vth_{prog}$, the greater the duration for which a logic value remains stored in the memory cell 200.

The selection transistor 220 makes it possible to extract a quantity of charge carriers from the floating layer 267 to determine a (virtually) negative erase value $Vth_{erase}$ for the memory transistor 215 without making the memory cell 200 unreadable (as would happen if the selection transistor 220 was omitted). This allows a distance between the erase value $Vth_{erase}$ and the program value $Vth_{prog}$ to be obtained to ensure high reliability of the memory cell 200 (e.g., ensuring a retention of a logic value stored in the order of about ten years).

The erase operation inhibition takes place by maintaining a reduced voltage drop on the capacitor insulating layer 255 upon the application of an erase voltage Ve to the terminal Tn (i.e., when the n well 225 is biased, through the n+ contact region 237, to the erase voltage Ve). This is achieved by imposing an inhibition voltage Vi of appropriate value to the terminal Tc.

For example, to inhibit the memory cell 200, an inhibition voltage Vi lower than the erase voltage Ve that is applied to the terminal Tn (e.g., Vc=15V>Vi=10V) is applied to the terminal Tc. The plate regions 231 and 234 (biased to the inhibition voltage Vi) form with the n+ contact region 237 (biased to the erase voltage Ve) a reverse biased p-n junction. Between such junction develops a voltage equal to Ve−Vi designed in such a way that a remaining voltage developed on the capacitor insulating layer 255 is not strong enough to promote the FN tunneling.

Because of the configuration of the erase operation inhibition just described, it is possible to arrange a matrix 105 of memory cells 200 fully provided with a single polysilicon layer 267 (i.e., by processes comprised in a standard CMOS technology), in which sets of memory cells 200 share a common n well 225 (as described hereinbelow).

Figure 3A:
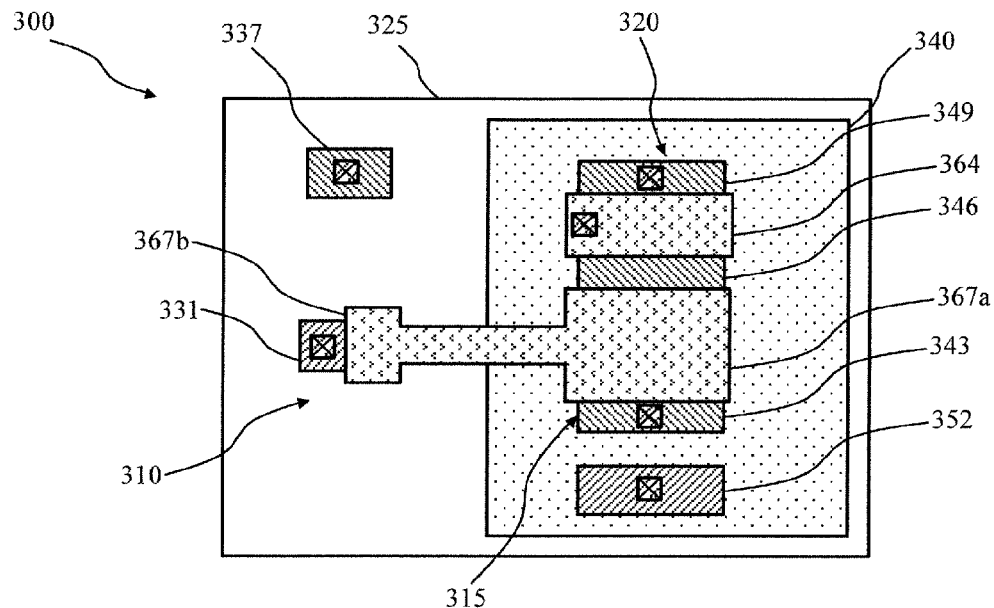
FIG. 3A is a schematic plan view of a memory cell according to another embodiment of the present invention.
Figure 3B:
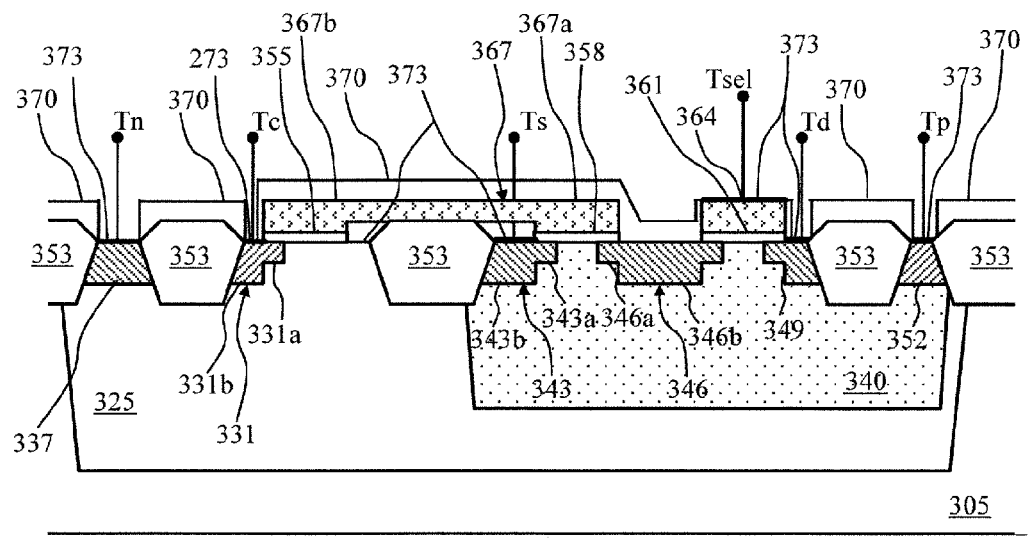
FIG. 3B is a schematic cross-sectional view of the memory cell of FIG. 3A.

Turning now to FIGS. 3A and 3B, which are schematic plan and cross-sectional views, respectively, of a memory cell 300 according to an embodiment, the memory cell 300 differs from the memory cell 200 in what follows (it should be noted that elements of the memory cell 300 corresponding to elements of the memory cell 200 are indicated by similar references and their description is not repeated for sake of brevity). The memory cell 300 comprises a single plate region 331 (instead of the two regions 231 and 234 present in the memory cell 200), comprising an extension portion 331a of the p* type extending under the substrate 355, and a main portion 331b (similarly to what is described above with reference to the regions 231 and 234).

The plate region 331, defines, in the n well region 325 underlying one end of the capacitor insulating layer 355, an electric field when biased through the terminal Tc to the erase voltage Ve. The electric field has an intensity to determine an extraction of electrons stored in the floating layer 367 substantially concentrated in an overlap region among the plate region 331 (and a portion of the channel region adjacent to the latter), the capacitor insulating layer 355, and the floating layer 367 (in a similar way to what happens in the floating gate transistors implemented in EEPROM memories). The structure of the capacitive element 310 thus obtained allows a more compact memory cell 300 than the memory cell 200, while maintaining substantially the same operation characteristics described above.

Referring to FIGS. 4A-4L, some steps of a manufacturing process of a memory cell 200 schematically illustrated in these figures will now be described. Initially (FIG. 4A), the decoupling elements 253 corresponding to the surface 228 are formed, and then the n well 225 is formed. A layer of photosensitive material, or resist, is deposited on the surface 228 of the p substrate 205, a portion of the resist (corresponding to a plan view of the decoupling layer 253) is defined by a mask (not shown) and is impressed by electromagnetic radiation (which passes through the mask). The impressed portion of the resist is selectively removed (e.g., via a chemical etching) so as to leave exposed a portion of the surface 228 of the substrate 205 corresponding to the plan view of the decoupling elements 253 to be formed. An insulating layer disposed on the surface 228 is removed from the portion of the surface 228 defined by the mask. At this point, the decoupling elements 253 are formed, for example by an etching process, to define the trenches, which are filled with insulating material by a chemical vapor deposition (CVD).

The n well 225 is formed in the p substrate 205. For example, the n well 225 may be formed by a known photolithographic process (in a similar way as described above) followed by a respective chemical vapor deposition (CVD) or a process of ion implantation in a selected portions of the chip not covered by the decoupling layer 253. Preferably, the deep region 225a of the n well 225 is formed by ion implantation. Subsequently (FIG. 4B), the p well 240 is formed inside the n well 225 in a similar manner as just described with respect to the formation of the latter.

Figure 4A:
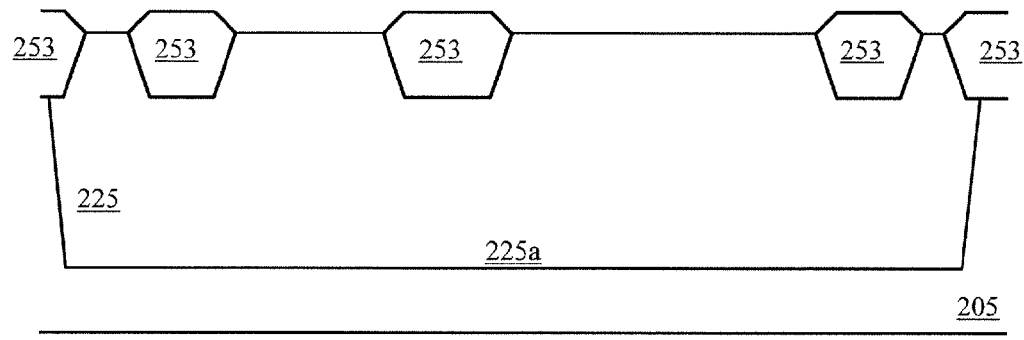
FIGS. 4A-4L illustrate schematically some steps of a production process of the memory cell of FIG. 2A.
Figure 4B:
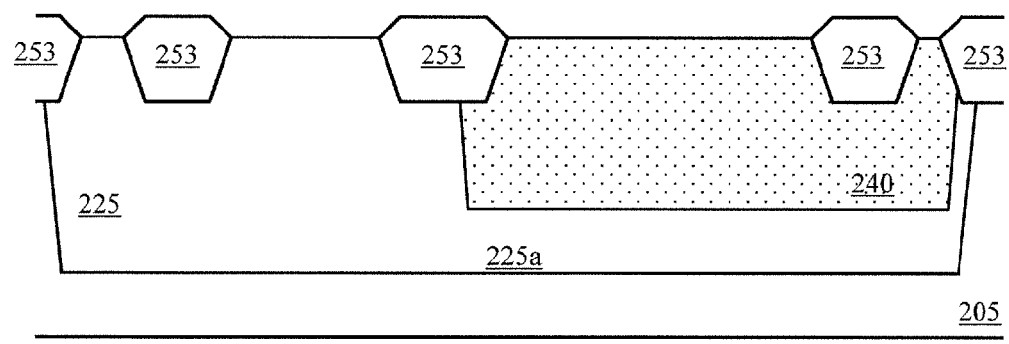
Figure 4C:
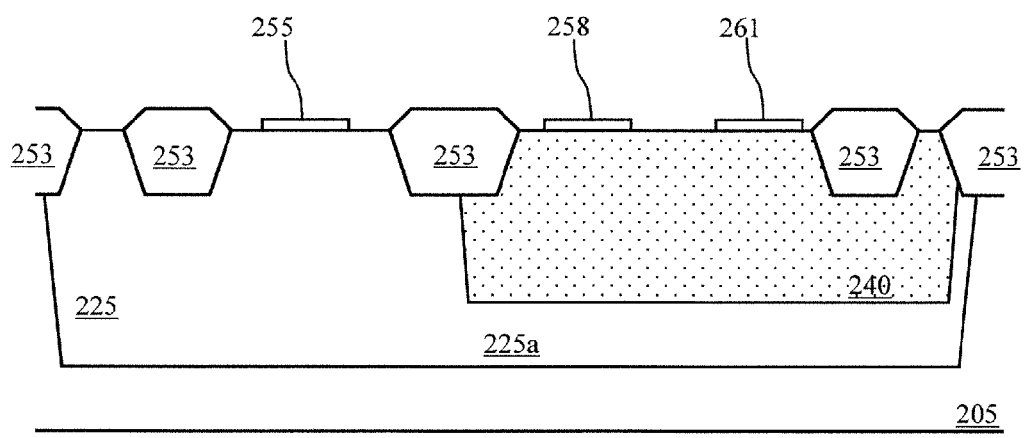

On the surface 228 of the substrate 205 the insulating layers 255, 258 and 261 are formed (FIG. 4C). For example, an oxide layer (or more) is initially formed by CVD and/or thermal oxidation. Selected portions of the oxide layer (e.g., again photolithography) are then removed (e.g., again through a chemical attack) to define the insulating layers 255, 258 and 261.

Figure 4D:
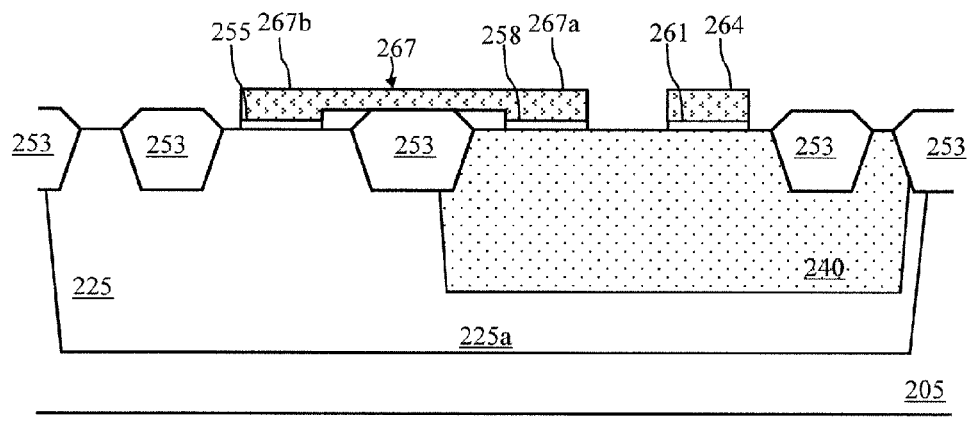

The floating layer 267 and the gate layer 264 are formed above the insulating layers 255 and 258, and the insulating layer selection 261, respectively (FIG. 4D). For example, the floating layer 267 and the gate layer 264 can be formed through a CVD phase.

Figure 4E:
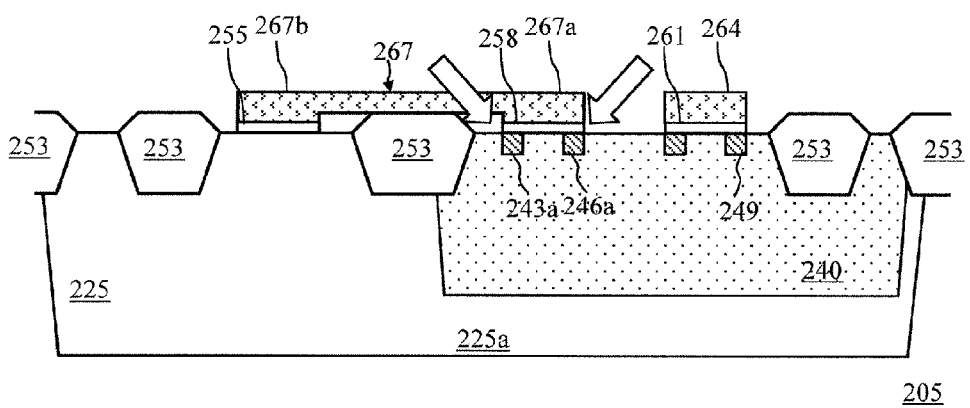

Subsequently, the extension portions 243a and 246a (and, optionally, the extension portions 246a' and 249a) of the n* type regions 243, 246 (and 249) are formed (FIG. 4E). For example, the extension portions 243a and 246a (246a' and 249a) may be formed via a ion implantation having an incidence angle with the transverse surface 228 (as indicated by the arrows in FIG. 4E) and exploiting the floating layer 267 and the gate layer 264 as self-aligning elements.

Figure 4F:
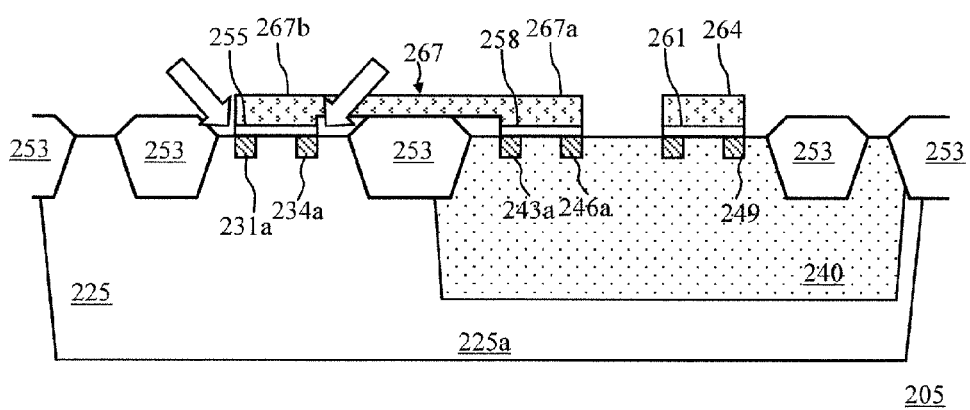

After the extension portions 243a and 246a the extension portions 231a and 234a of the p* type regions 231 and 234 are formed (FIG. 4F). For example, the extension portions 231a and 234a may be formed via a ion implantation having an incidence angle to the transverse surface 228 (as indicated by the arrows in FIG. 4F) and exploiting the floating layer 267 as self-aligning element (as described above).

Figure 4G:
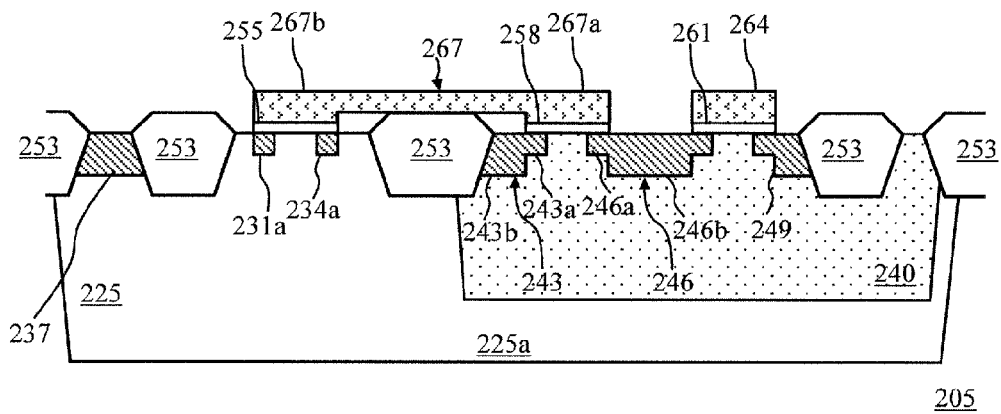
Figure 4H:
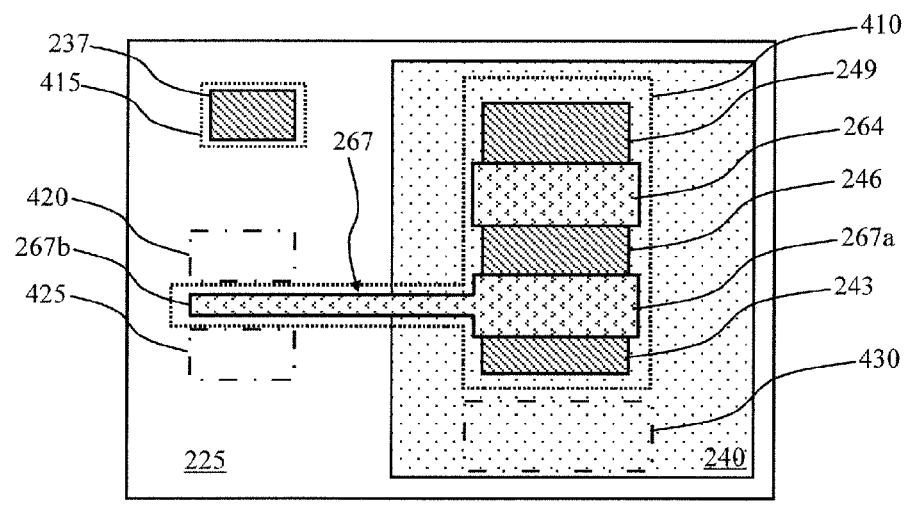

At this point, the floating layer 267, the gate layer 264 and the underlying insulating layers 255 and 258, respectively, are subjected to an oxidation process (e.g., thermal oxidation) to be coated by an insulating spacer layer (or spacer, not illustrated in the figures for simplicity) formed on side surfaces thereof. Subsequently the n+ type regions 237 and 249, and the main portions 243a, 246a of the regions 243 and 246 (FIGS. 4G and 4H). For example, the regions 237 and 249, and the main portions 243a, 246a may be formed through a process of ion implantation in the n well 225 and in the p well 240.

In one embodiment (FIG. 4F), the main portions 243a, 246a and the region 249 may be defined by exploiting the floating layer 267 and the gate layer 264 (and the related insulating layers spacers) as self-aligning elements, thus having the possibility of using a single mask 410 to define the main portions 243a, 246a and the region 249, while a further mask 415 is used to define the n+ contact region 237.

It should be noted that also the floating layer 267 and the gate layer 264 receive a n+ type doping during the process. Advantageously, the mask 410 is designed in such a way that the entire floating layer 267 is uniformly exposed to the same n+ type doping via ion implantation (in other words, the floating layer 267 has a polysilicon having the same n+ type doping from the transistor portion 267a to the capacitor portion 267b). In this way, it is possible to form the floating layer 267 without spurious pn junctions and therefore without the deposition of a layer of conductive silicide on the floating layer 267.

Figure 4I:
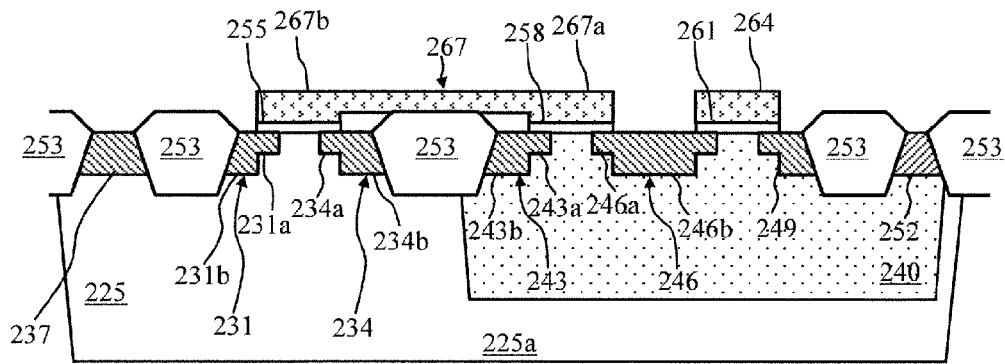
Figure 4J:
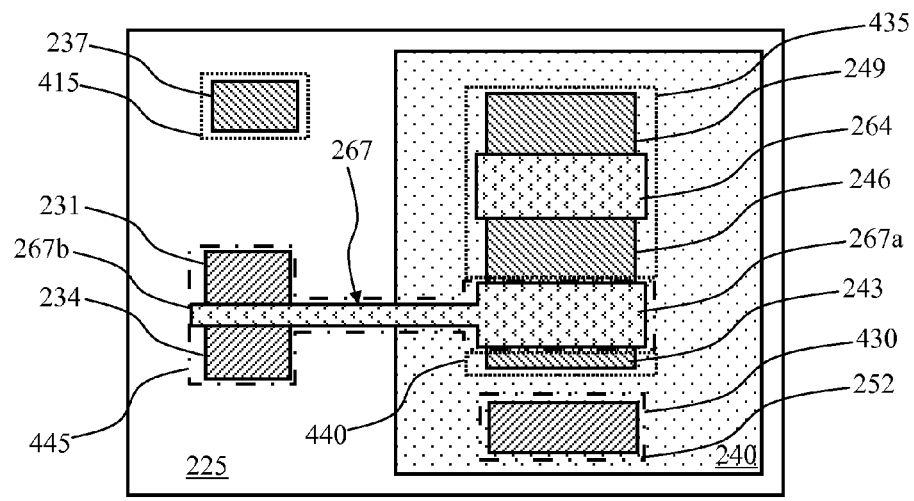

Afterwards the p+ type p+ contact region 252 and the main portions 231b and 234b of the plate regions 231 and 234 are formed (FIG. 4I). For example, the p+ contact region 252 and the main portions 231b and 234b may be formed by ion implantation through areas of the surface 228 defined by masks 420, 425 and 430, respectively (shown in FIG. 4H), in a similar way to the above described.

In an alternative embodiment (FIG. 4J), the main portion 243b and the main portion 246b with the region 249 are defined using two separate masks 435 and 440, respectively—in which the gate layer 264 acts as a self-aligning element to define the main portion 246a and the p+ contact region 249. The main portions 231b and 234b may be defined by exploiting the floating layer 267 as a self-aligning element with a single mask 445 for defining the main portions 231b and 234b.

It should be noted that, in this case, the floating layer 267 receives a p+ type doping during this phase of the process. Advantageously, the mask 445 is designed in such a way that the entire floating layer 267 is exposed uniformly to the same type doping p+ through ion implantation (in other words, the floating layer 267 has a polysilicon with the same p+ type doping from the transistor portion 267a to the capacitor portion 267b).

Figure 4K:
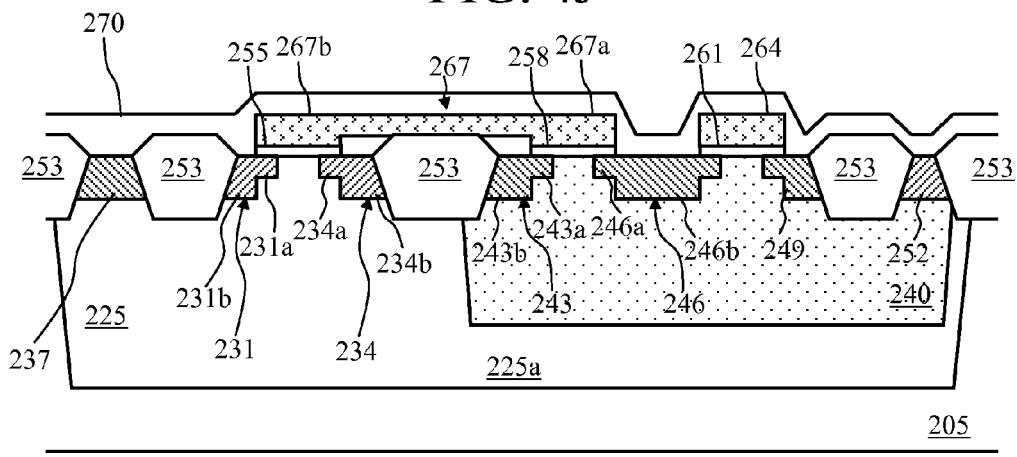

The surface 228 of the substrate 205, the floating layer 267, the gate layer 264 and the insulating layers 255, 258 and 261 are then coated by one or more oxide layers 270 (e.g., a layer of silicon oxide and/or silicon nitride), for example by thermal oxidation and/or CVD (FIG. 4K). In this way, the floating layer 267 is electrically insulated from what is formed in the substrate 205.

Figure 4L:
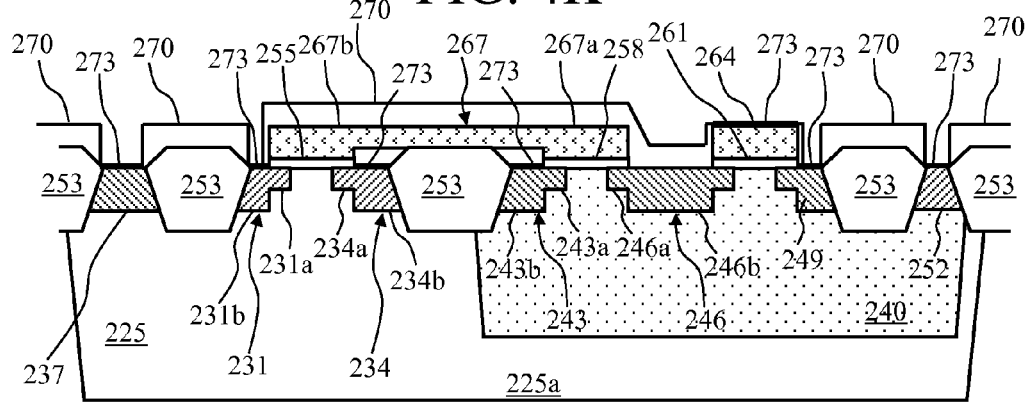

The oxide layers 270 are selectively removed (e.g., by chemical etching) corresponding to regions 237, 231, 234, 243, and 249 and the gate layer 264 (e.g., in areas defined by a photolithographic process), which are then subjected to a silicidation process of (FIG. 4L). The silicidation deposits a salicide layer 273 of a transition metal (e.g., cobalt) on the surface 228 corresponding to regions 237, 231, 234, 243, 246 and 249 and on the gate layer 264 to facilitate a subsequent electric connection with metal elements formed later through higher metallization levels to provide the terminals Tn, Tc, Ts, Td, Tp and Tsel previously described.

Similar steps are implemented to manufacture the memory cell 300, mutatis mutandis, in particular, a single plate region 331 is formed, instead of the two plate regions 231 and 234 of the memory cell 200.

Figure 5:
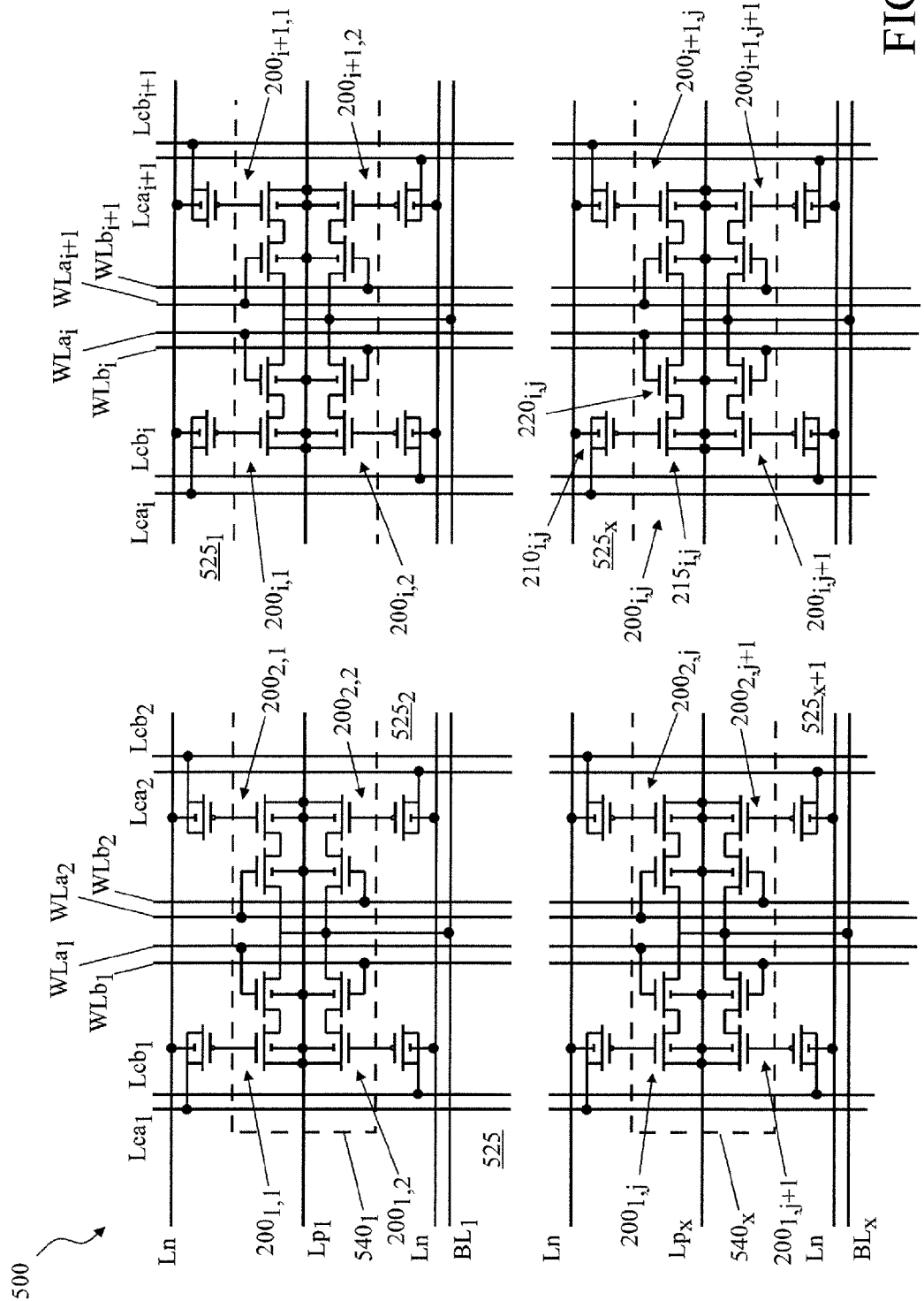
FIG. 5 is a circuit diagram of a portion or sector of matrix of memory cells according to an embodiment of the present invention.

With reference now to FIG. 5, a conceptual circuit diagram of a portion, or sector 500, of a matrix 105 of memory cells $200_{i,j}$ according to an embodiment is illustrated. The matrix 105 comprises a plurality of memory cells $200_{i,j}$ arranged in columns i (i=1, . . . , I, I>0) and rows j (j=1, . . . , J, J>0). The plurality of memory cells $200_{i,j}$ is preferably divided into groups or sectors (of which the sector 500 in FIG. 5 is an example) of the memory cell $200_{i,j}$. The memory cells $200_{i,j}$ of each sector 500 are formed in a shared n well 525 (corresponding to the n well 225 illustrated in FIGS. 2A and 2B).

In an alternative embodiment (not shown), all the memory cells $200_{i,j}$ of the matrix 105 are formed in a same shared n well 525. In the shared n well 525 a p well $540_x$ is formed (corresponding to the p well 240 illustrated in FIGS. 2A and 2B) shared by pairs of rows j and j+1 consecutive in the matrix 105 (therefore x=1, . . . , X, X=J/2).

In the generic shared p well $540_x$, the read portion of the memory cells $200_{i,j}$ are formed (i.e., the memory transistors $215_{i,j}$, the selection transistors $220_{i,j}$ and the p+ contact regions $252_{i,j}$) aligned on the row j and aligned on the row j+1. Alternatively, a single contact region of the well (not shown) may be formed in each p well $540_x$ for biasing it.

The well terminals $Tp_{i,j}$ (connected to the p+ contact regions $252_{i,j}$) and the source terminals $Ts_{i,j}$ (connected to the source regions $243_{i,j}$) of the memory cells $200_{i,j}$ aligned on the row j, as well as well terminals $Tp_{i,j+1}$ and the source terminals $Ts_{i,j+1}$ of the memory cells $200_{i,j+1}$ aligned on row j+1, are connected to a same well line $Lp_x$ (for example connected to the decoder row 115r). The drain terminals $Td_{i,j}$ (connected to the drain regions $249_{i,j}$) of the memory cells $200_{i,j}$ aligned on the row j and the drain terminals $Td_{i,j+1}$ of the memory cells $200_{i,j+1}$ aligned on the row j+1 are connected to a same bit line $BL_x$ (for example, connected to the row decoder 115r).

The selection terminal $Tsel_{i,j}$ of each memory cell $200_{i,j}$ is connected to a respective word line or word line $WLa_i$ or $Wlb_i$ (e.g., connected to the column decoder 115c). Preferably, each memory cell $200_{i,j}$ aligned on the same column is connected to a word line $WLa_i$ or $WLb_i$ according to whether the second memory cell is aligned on an odd or even row j, respectively (with each memory cell $200_{i,j}$ in the odd positions in the column connected to the same word line $WLa_i$ and each memory cell $200_{i,j}$ in even position in the column connected to the same word line $WLb_i$). In this way, the reading operations for independent memory cells $200_{i,j}$ and $200_{i,j+1}$ which read portions (i.e., transistors $215_{i,j}$, $220_{i,j}$ and $215_{i,j+1}$ and $220_{i,j+1}$, respectively) are formed in the same p well $540_x$ and share the same bit line $BL_x$ aligned on the same column i.

The capacitive elements $210_{i,j}$ the n+ contact regions $237_{i,j}$ are formed within the n well 525 into n well portions $525_x$ and $525_{x+1}$ separated from the shared p well $540_x$. Alternatively, a single well contact region (not shown) may be formed in the n well 525 for biasing the same. The n well terminal $Tn_{i,j}$ of each memory cell $200_{i,j}$ is connected to a shared n well line Ln (for example, connected to the column decoder 115c).

The capacitor terminal $Tc_{i,j}$ (connected to the plate regions $231_{i,j}$ e $234_{i,j}$) of each memory cell $200_{i,j}$ aligned on the same column is connected to a control line or $Lca_i$ or $Lcb_i$ (connected to the column decoder 115c) according to which the memory cell is aligned on a row j odd or even, respectively (with each memory cell $200_{i,j}$ in an odd position in the column connected to the same control line Lcai and each memory cell $200_{i,j}$ in an even position in the column connected to the same control line $Lcb_i$). In this way, it is possible to maintain the reading, program, and erase operations independent, as well as the inhibition of the latter, for the memory cells $200_{i,j}$ and $200_{i,j+1}$ which read portions are formed in the same p well $540_x$ and aligned on the same column, which share the same bit line $BL_x$.

In Table 2 hereinbelow, biasing schemes analogous to what shown in Table 1 but applied to the signal lines Ln, $Lca/b_i$, $Lp_x$, $WLa/b_i$ and $BL_x$ (connected to terminals $Tn_{i,j}$, $Tc_{i,j}$, $Ts_{i,j}$, $Td_{i,j}$, $Tp_{i,j}$ and $Tsel_{i,j}$ of the memory cells $200_{i,j}$) are shown.

TABLE 2

|  | Ln | Lca/b$_i$ | WLa/b$_i$ | Lp$_x$ | BL$_x$ |
| --- | --- | --- | --- | --- | --- |
| Erase | Ve | Ve | GND | GND | GND |
| Program | GND | Vp | GND | GND | GND |
| Reading | Vr | Vr | Vdd | GND | Vd |
| Erase inhibition 1 | Ve | Vi | GND | GND | GND |
| Erase inhibition 2 | Ve | N.A. | GND | Vi | Vi |

It should be noted that in Table 2 two biasing schemes for the inhibition of the erase operation are shown. The first erase inhibition biasing scheme—indicated as erase inhibition 1—may be applied during the erase operation of a memory cell $200_{i,j}$ formed in a p well $540_x$ to inhibit the erase portion in the other memory cells formed in the same well $540_x$ and aligned on the same row j. Otherwise, the second biasing erase inhibition scheme—indicated as erase inhibition 2—may be applied during the erase portion of the memory cell $200_{i,j}$ whose read portion is formed in the p well $540_x$, to inhibit the erase operation in the other memory cells formed in different p wells and lined up on the same column.

Because of the structure of the matrix 105 described above, it is possible select an erase operation granularity. In one embodiment, it is possible to perform the erase portion jointly on all memory cells $200_{i,j}$ in the sector 500 (as in the case of an NVM FLASH type), on a word (i.e., all the memory cells $200_{i,j}$ aligned on a same column of the matrix 105) of the sector 500, or on a single memory cell $200_{i,j}$ separately (as in the case of an NVM EEPROM type).

In greater detail, to obtain the cancellation of the entire sector 500 the biasing scheme for the erase operation all memory cells $200_{i,j}$ in the sector 500 (via the signal lines Ln, $Lca/b_i$, Lpj, $WLa/b_i$ and $BL_x$) may be applied. The erasure of a word is obtained by applying the erase biasing scheme to the memory cells $200_{i,j}$ of the same word (i.e., aligned on the same column) and the erase inhibition biasing 1 to the memory cells $200_{i,j}$ aligned along different columns.

Finally, it is possible to perform the erase operation of a single memory cell $200_{i,j}$ by applying the erase biasing scheme to the memory cell $200_{i,j}$ to be erased and the erase inhibition biasing 1 to the memory cells whose read portions are formed in the same shared p well $540_x$. It may also be desirable to apply the erase inhibition scheme 2 to the memory cells $200_{i,j}$ whose read portions are formed in a shared p well different from the shared p well $540_x$ where the read portion of the memory cell $200_{i,j}$ to be erased is formed. Even the program operation has a selectable granularity in the matrix 105 according to one embodiment.

Advantageously, using the program biasing scheme on a single word in the sector 500, it is possible to perform the program operation limited thereto. Alternatively, it is possible to perform the program operation on the whole sector 500 by applying the pattern of biasing of programming to all the words of sector 500. The reading of the logic values stored in each memory cell $200_{i,j}$ in the sector 500 may be performed cell by cell by applying the reading biasing scheme of the signal lines Ln, Lca/$b_i$, L$p_x$, WLa/$b_i$ and BL$_x$ connected to a selected memory cell $200_{i,j}$.

The emNVM 100 according to one embodiment may be configured for storing data in differential mode. This mode allows a greater reliability of the correctness of the data stored than the normal storage mode to be obtained.

According to the differential mode, each datum is stored configuring complementary logic values in a pair of memory cells (e.g., the memory cells $200_{1,1}$ and $200_{i,j}$). The data associated with each pair of memory cells $200_{1,1}$ and $200_{i,j}$ is determined by comparing the currents generated by the memory cells $200_{1,1}$ and $200_{i,j}$ of the pair during the read operation.

The emNVM 100 may effectively implement the differential storage mode because of the distance between the erase value Vth$_{erase}$ and the program value Vth$_{prog}$ mentioned above, which allows currents generated by the memory cells $200_{1,1}$ and $200_{i,j}$ of the pair having substantially different intensities to be obtained. In this way, the comparison between the currents generated by the memory cells $200_{1,1}$ and $200_{i,j}$ of a pair is less prone to errors, thereby improving the reading efficiency of the emNVM 100 (at the same time, relaxing the design constraints to which a current comparison element, such as a sense amplifier, is subject).

Advantageously, the structure of the memory cell $200_{i,j}$ allows to use voltages Vp, Vr, and Vd with values lower than or equal to the value of the supply voltage Vdd, to be thus obtained without exploiting voltage multiplier devices such as charge pumps. In this way, only the n well line Ln and the capacitor line Lca/$b_i$ generally have to be dimensioned to operate with voltage Ve or Vi having a value greater than the value of the supply voltage Vdd. In other words, only the lines Ln and Lca/$b_i$ are subject to more stringent design constraints to operate correctly at the desired value of the voltage Ve and Vi. This also allows for a general reduction of the complexity of the circuitry included in the row decoder 115r, in the column decoder 115c, and into the read/write unit 120 (only the lines Ln and Lca/$b_i$ have to be connected to an element able to bias them at high voltages as a high voltage driver) thereby allowing a further area saving.

It should be noted that it may be possible to produce an alternative matrix 105 (not shown) that includes a plurality of memory cells 300 in the same way as just described with respect to FIG. 5, mutatis mutandis. Also in this case, it is possible to obtain the same advantages described above, in addition to the more compact structure of the memory cell 300 which further reduces an area consumption of the emNVM 100 for the same data storage.

Because of the arrangement of the memory cells $200_{i,j}$ within the sector 500, the control of the matrix 105 may be considered simple and versatile.

Figure 6:
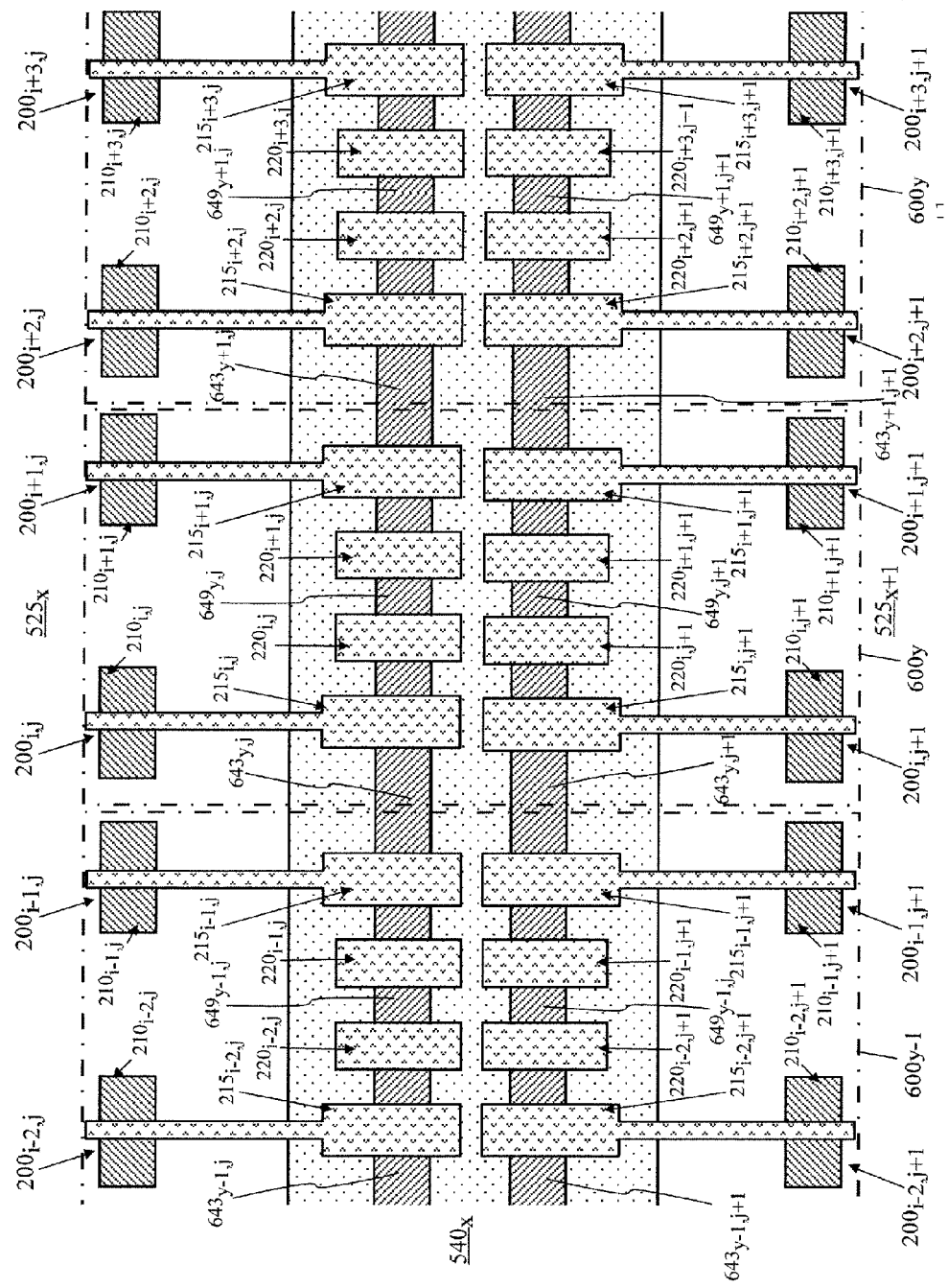
FIG. 6 is a schematic plan view of a portion of the field of the matrix of memory cells according to one embodiment.

Consider now FIGS. 5 and 6 jointly, the latter being a schematic plan view of a portion of the sector 500 of the matrix 105 of memory cells $200_{i,j}$. Within the sector 500, the memory cells $200_{i,j}$ are formed according to a highly symmetric arrangement, which allows a compact structure of the sector 500 to be obtained.

In one embodiment, in each generic memory cell $200_{i,j}$, the memory transistor $215_{i,j}$ shares a common source region $643_{y,j}$ (corresponding to the source regions $243_{1-i,j+1}$ and $243_{i,j}$ where y=1, ..., Y, Y=I/2) with the memory transistor $215_{i-1,j}$ of the memory cell $200_{i-1,j}$, which occupies a previous position along the row j, and the selection transistor $220_{i,j}$ shares a common drain region $649_{y,j}$ (corresponding to the drain regions $249_{i,j}$ and $249_{i,j+1}$) with the selection transistor $220_{i+1,j}$ of the memory cell $200_{i+1,j}$, which occupies a next position in the row j or, symmetrically, in each generic memory cell $200_{i+1,}$. The selection transistor $220_{i+1,j}$ shares the common drain region $649_{y,j}$ with the selection transistor $220_{i,j}$ of the memory cell $200_{i,j}$ that precedes it along the row j, and the memory transistor $215_{i+1,j}$ shares a common source region $643_{y+1,j}$ with the memory transistor $215_{i+2,j}$ of the memory cell $200_{i+2,j}$ that occupies a next position along the row j. In other words, in each row j of the matrix 105, memory cells $200_{i,j}$ aligned on a same row alternately share the common source region $643_{y,j}$ of the respective memory transistors $215_{i,j}$ or the common drain region $649_{y,j}$ of the respective selection transistors $220_{i,j}$ with a memory cell $200_{i-1,j}$ in a previous position in the row j alternately sharing the common drain region $649_{y,j}$ of the respective selection transistors $220_{i,j}$ or the common source region $643_{y,j}$ of the respective memory transistors $215_{i,j}$ with a memory cell $200_{i+1,j}$ in a next position in the row j.

Otherwise, the control portions (i.e., the capacitive elements $210_{i,j}$ and $210_{i,j+1}$) of the adjacent memory cells $200_{i,j}$, $200_{i,j+1}$ (formed in the same shared p well $540_x$) are formed in the portions $525_x$ and $525_{x+1}$ of the shared n well 525 separated by the shared p well $540_x$. The capacitive elements $210_{i,j}$ of the memory cells $200_{i,j}$ aligned on row j are formed in a sub-region $525_x$ of the shared n well 525 delimited by the p wells $540_{x-1}$ and $540_x$. The capacitive elements $210_{i,j+1}$ of the memory cells $200_{i,j+1}$ aligned on the row j+1 are formed in a sub-region $525_{x+1}$ of the shared n well 525 delimited by the p wells $540_x$ and $540_{x+1}$.

In one embodiment, the symmetrical arrangement of the memory cells $200_{i,j}$ and $200_{i,j+1}$ just described allows identifying of a plurality of clusters $600_y$ aligned sequentially along the respective shared p well $540_x$, each comprising four memory cells, for example the memory cells $200_{i,j}$, $200_{i+1,j}$, $200_{i,j+1}$ and $200_{i+1,j+1}$ whose read portions are formed in a same shared p well $540_x$ form the generic cluster $600_y$. The selection transistors $220_{i,j}$ and $220_{i,j+1}$ of the memory cells $200_{i,j}$ and $200_{i+1,j}$ (aligned on the same row j) of the cluster $600_y$ share the shared drain region $649_{y,j}$, while the memory cells $200_{i,j+1}$ and $200_{i+1,j+1}$ (aligned on the same row j+1) of the cluster $600_y$ share a common drain region $649_{y,j+1}$.

The memory transistors $215_{i,j}$ and $215_{i,j+1}$ of the memory cells $200_{i,j}$ and $200_{i,j+1}$ (aligned on the same column i) of the cluster $600_y$ share the shared source regions $643_{y,j}$ and $643_{y,j+1}$, respectively, with the memory transistors $215_{i-1,j}$ and $215_{i-1,j+1}$ of the memory cells $200_{i-1,j}$ and $200_{i-1,j+1}$ of a previous cluster $600_y-1$ in the sequence of clusters $600_y$ formed in the same shared p well $540_x$. Similarly, the memory transistors $215_{i+1,j}$ and $215_{i+1,j+1}$ of the memory cells $200_{i,j}$, $200_{i,j+1}$ (aligned on the same column i+1) of the cluster $600_y$ share the shared source regions $643_{y+1,j}$ and $643_{y+1,j}+1$, respectively, with the memory transistors $215_{i+2,j}$ and $215_{i+2,j+1}$ of the memory cells $200_{i+2,j}$, $200_{i+2,j+1}$ of a next cluster $600_{y+1}$ in the sequence of clusters $600_y$ formed in the same shared p well $540_x$.

Coherently with the above, the plate regions $231_{i,j}$ and $234_{i,j}$ of the capacitive element $210_{i,j}$ are connected to the control line $Lca_i$, the plate regions $231_{i,j+1}$ and $234_{i,j+1}$ of the capacitive element $210_{i,j+1}$ are connected to the control line $Lcb_i$. The plate regions $231_{i+1,j+1}$ and $234_{i+1,j+1}$ of the capacitive element $210_{i+1,j}$ are connected to a respective control line $Lca_{i+1}$, and the plate regions $231_{i+1,j+1}$ and $234_{i+1,j+1}$ of the capacitive element $210_{i+1,j+1}$ are connected to a respective control line $Lcb_{i+1}$. In this way, each pair of generic memory cells $200_{i,j}$ and $200_{i,j+1}$ aligned on the same column i and formed in the same shared p well $540_x$ receives a separate control signal via the control line and $Lca_i$ or $Lcb_i$, respectively.

As indicated above, the gate region $264_{i,j}$ of the selection transistor $220_{i,j}$ is connected to a respective word line or word line $WLa_i$, and the gate region $264_{i,j+1}$ of the selection transistor $220_{i,j+1}$ is connected to a respective word line $WLb_i$. The gate region $264_{i+1,j}$ of the selection transistor $220_{i+1,j}$ is connected to a respective word line or word line $WLa_{i+1}$, and the gate region $264_{i+1,j+1}$ of the selection transistor $220_{i+1,j+1}$ is connected to a respective word line $WLb_{i+1}$. In this way, each generic pair of memory cells $200_{i,j}$ and $200_{i,j+1}$ aligned on the same column i and formed in the same shared p well $540_x$ receive a distinct signal word via the word lines $WLa_i$ and $WLb_i$, respectively. Finally, the shared drain regions $649_{y,j}$ and $649_{y,j+1}$ of the generic cluster $600_y$ are coupled to the corresponding bit line $BL_x$ and the shared source regions $643_{y,j}$ and $643_{y,j+1}$ are coupled to the corresponding well line $Lp_x$.

Because of the structure of the clusters $600_y$ that share shared regions $643_{y,j}$ and $643_{y,j+1}$, it is possible to implement a very compact sector 500, thereby allowing a compact matrix 105 to be obtained. Indeed, the structure of the clusters $600_y$ allows maintaining a reduced extension of the rows j of the matrix 105. In other words, it is possible to maintain a reduced pitch between the memory cells $200_{i,j}$ aligned along a same row j of the matrix 105.

Moreover, the structure of memory cells $200_{i,j}$ with the capacitive elements $210_{i,j}$ formed in the n well 525 (rather than in a dedicated p well) allows maintaining a reduced extension of the generic of the n well portions $525_x$ defined between generic adjacent p wells $540_{x-1}$ and $540_x$. In other words, a reduced pitch between the memory cells $200_{i,j}$ aligned along a same column i of the matrix 105 may be obtained.

In other embodiments (not shown), a different sector j may be implemented in which each row of memory cells $200_{i,j}$ is formed in a respective p well. In this case, the set of signal lines connected to terminals $Tc_{i,j}$, $Td_{i,j}$ and $Tsel_{i,j}$ of the memory cells $200_{i,j}$ is also implemented differently. For example, the drain terminals $Td_{i,j}$ of the memory cells $200_{i,j}$ aligned on the row j may be connected to the same bit line (i.e., a bit line is provided for each row j of memory cells $200_{i,j}$). The selection terminal $Tsel_{i,j}$ of each memory cell $200_{i,j}$ aligned on the same column i is connected to a respective word line (i.e., a word line is provided for each column of the memory cell $200_{i,j}$). The control terminal $Tc_{i,j}$ of each memory cell $200_{i,j}$ aligned on the same column is connected to a respective first control line.

Naturally, also the memory cells 300 may be implemented in a matrix 105 with an arrangement similar to that described above, mutatis mutandis, obtaining the same advantages described above. Moreover, the structures of non-volatile memory described above in relation to a non-volatile memory integrated can be implemented in a non-volatile memory not integrated without requiring substantial changes.

The invention claimed is:

1. A non-volatile memory integrated in a chip of semiconductor material, the non-volatile memory comprising:
    a plurality of memory cells arranged in a plurality of rows and columns, each memory cell comprising
        a read portion,
        a control portion,
        an electrically floating layer comprising conductive material and coupling the read portion and the control portion to define a first capacitive coupling with the read portion, and a second capacitive coupling with the control portion,
        the read portion of each memory cell being formed in the chip in a first well of semiconductor material having a doping of a first type, the control portion being formed in the chip in a second well in semiconductor material having a doping of a second type,
        the read portion being configured to be traversed by an electric current indicative of a logic value stored in a given memory cell during a read operation of the given memory cell,
        the first capacitive coupling defining a first capacity greater than a second capacity defined by the second capacitive coupling,
        the control portion being configured to be traversed by an electric current configured to one of inject charge carriers into and extract charge carriers from the electrically floating layer to store a one of first logic value and a second logic value, respectively, in the memory cell.

2. The non-volatile memory according to claim 1, wherein the control portion is configured to
    inject charge carriers in the electrically floating layer based upon injection of band-to-band tunneling-induced hot electrons; and
    extract charge carriers from the electrically floating layer based upon Fowler-Nordheim tunneling;
    wherein a coupling factor defined by a ratio between the first capacitance and a sum of the first capacitance with the second capacitance is less than or equal to 0.5.

3. The non-volatile memory according to claim 1, wherein the read portion comprises a first transistor and a second transistor, each having a source region, a drain region and a gate region, the first and second transistors having a common region of semiconductor material having a doping of the second type corresponding to the drain region of the first transistor and to the source region of the second transistor; wherein the control portion comprises a capacitive element; and wherein the electrically floating layer defines the gate region of the first transistor and a first plate region of the capacitive element.

4. The non-volatile memory according to claim 3, further comprising a first contact region of semiconductor material having a doping of the first type in the first well; wherein the first transistor further comprises a source region in the semiconductor material having a doping of the second type; the non-volatile memory further comprising a connecting line and a first insulating layer comprising electrically insulating material between the first gate region and the source and shared regions, and coupling the source region to the first contact region; the non-volatile memory further comprising a row connecting line and a word line; wherein the second transistor further comprises a drain region in the semiconductor material having a doping of the second type connected to the row connecting line, a second gate region comprising conductive material coupled to the word line, and a second insulating layer of electrically insulating material between the second gate region and the drain and shared regions; and further comprising a second well connecting line, a control connection line, and, in the second well, a second contact region of semiconductor material having a doping of the second type and connected to the second-well connecting line, at least one second plate region of the capacitive element of semiconductor material having a doping of the first type connected to the control connecting line and a third insulating layer of electrically insulating material between the first plate region and the at least one second plate region.

5. The non-volatile memory according to claim 1, wherein the read portion of the plurality of memory cells aligned along pairs of adjacent rows are formed in a respective first well, each respective first well being formed in a shared second well.

6. The non-volatile memory according to claim 5, wherein the plurality of memory cells is divided into at least one sector each comprising at least one portion of the plurality of memory cells of the matrix of memory cells, the control portions of the plurality of memory cells of the at least one sector being in a same second well shared by memory cells in the at least one sector.

7. The non-volatile memory according to claim 6, wherein, for each pair of adjacent rows having the respective read portions in a respective first well, the control portions of the plurality of memory cells aligned along a first row of the pair are in a first portion of the second well, and wherein the control portions of the plurality of memory cells aligned along a second row of the pair are in a second portion of the second well, the first portion of the second well and the second portion of the second well being separated from the respective first well.

8. The non-volatile memory according to claim 7, wherein the read portion comprises a first transistor and a second transistor, each having a source region, a drain region and a gate region, the first and second transistors having a common region of semiconductor material having a doping of the second type corresponding to the drain region of the first transistor and to the source region of the second transistor; wherein the control portion comprises a capacitive element; wherein the electrically floating layer defines the gate region of the first transistor and a first plate region of the capacitive element; wherein the plurality memory cells aligned on a same row alternately share one of the source region of the first transistor and the drain region of the second transistor with a respective one of the first transistor and the second transistor of a memory cell in a previous position in the row of memory cells.

9. A non-volatile memory comprising:
a plurality of memory cells arranged in a plurality of rows and columns, each memory cell comprising
a read portion,
a control portion,
an electrically floating layer comprising conductive material and coupling the read portion and the control portion to define a first capacitive coupling with the read portion, and a second capacitive coupling with the control portion,
the read portion of each memory cell to be in a first well of semiconductor material having a doping of a first type, the control portion being formed in a second well in semiconductor material having a doping of a second type,
the first capacitive coupling defining a first capacity greater than a second capacity defined by the second capacitive coupling,
the control portion being configured so that an electric current one of injects charge carriers into and extracts charge carriers from the electrically floating layer.

10. The non-volatile memory according to claim 9, wherein the control portion is configured to
inject charge carriers in the electrically floating layer based upon injection of band-to-band tunneling-induced hot electrons; and
extract charge carriers from the electrically floating layer based upon Fowler-Nordheim tunneling;
wherein a coupling factor defined by a ratio between the first capacitance and a sum of the first capacitance with the second capacitance is less than or equal to 0.5.

11. The non-volatile memory according to claim 9, wherein the read portion comprises a first transistor and a second transistor, each having a source region, a drain region and a gate region, the first and second transistors having a common region of semiconductor material having a doping of the second type corresponding to the drain region of the first transistor and to the source region of the second transistor; wherein the control portion comprises a capacitive element; and wherein the electrically floating layer defines the gate region of the first transistor and a first plate region of the capacitive element.

12. A method for manufacturing a non-volatile memory integrated in a chip of semiconductor material, the non-volatile memory comprising a plurality of memory cells arranged in a plurality of rows and columns, the method comprising:
providing the chip of semiconductor material;
forming a first well of semiconductor material having a doping of a first type in the chip;
forming a second well of semiconductor material having a doping of a second type in the chip; and
for each memory cell
forming a read portion in the first well configured to be traversed by an electric current indicative of a logic value stored in the memory cell during a read operation of the memory cell,
forming a control portion in the second well, and
forming an electrically floating layer of conductive material to define a first capacitive coupling with the read portion and a second capacitive coupling with the control portion,
wherein forming the electrically floating layer comprises forming the first capacitive coupling to define a first capacity greater than a second capacity defined by the second capacitive coupling,
wherein forming the control portion comprises configuring the control portion to be traversed by an electric current adapted to one of inject charge carriers into and extract charge carriers from the electrically floating layer to store one of a first logic value and a second logic value, respectively, in the memory cell.

13. The method according to claim 12, wherein the step of forming the electrically floating layer comprises:
depositing a polysilicon layer corresponding to the electrically floating layer; and
subjecting the entire polysilicon layer to a same doping of one of the first type and the second type so that the electrically floating layer of conductive material has a uniform doping.

14. The method according to claim 12, wherein the method is performed using a standard complementary metal oxide semiconductor (CMOS) process apparatus.

15. A method of making a non-volatile memory comprising a plurality of memory cells arranged in a plurality of rows and columns, the method comprising:

forming a first well of semiconductor material having a doping of a first type;

forming a second well of semiconductor material having a doping of a second type; and for each memory cell
- forming a read portion in the first well,
- forming a control portion in the second well, and
- forming an electrically floating layer of conductive material to define a first capacitive coupling with the read portion and a second capacitive coupling with the control portion,
- wherein forming the electrically floating layer comprises forming the first capacitive coupling to define a first capacity greater than a second capacity defined by the second capacitive coupling,
- wherein forming the control portion comprises configuring the control portion so that an electric current one of injects charge carriers into and extracts charge carriers from the electrically floating layer.

16. The method according to claim 15, wherein forming the electrically floating layer comprises:

depositing a polysilicon layer corresponding to the electrically floating layer; and subjecting the polysilicon layer to a same doping of one of the first type and the second type so that the electrically floating layer of conductive material has a uniform doping.

* * * * *